(12) United States Patent
Chang (10) Patent No.: US 11,693,440 B2
(45) Date of Patent: Jul. 4, 2023

(54) VOLTAGE REGULATOR

(71) Applicant: GUTSCHSEMI LIMITED, Hong Kong (HK)

(72) Inventor: Kuo-Wei Chang, Taipei (TW)

(73) Assignee: GUTSCHSEMI LIMITED, Hong Kong (HK)

( * ) Notice: Subject to any disclaimer, the term of this patent is extended or adjusted under 35 U.S.C. 154(b) by 179 days.

(21) Appl. No.: 17/409,801

(22) Filed: Aug. 24, 2021

(65) Prior Publication Data

US 2022/0382309 A1 Dec. 1, 2022

Related U.S. Application Data (60) Provisional application No. 63/192,583, filed on May 25, 2021.

(51) Int. Cl.
*G05F 1/575* (2006.01)
*G05F 1/56* (2006.01)

(52) U.S. Cl.
CPC .............. *G05F 1/575* (2013.01); *G05F 1/56* (2013.01)

(58) Field of Classification Search
CPC ................................. G05F 1/575; G05F 1/468
See application file for complete search history.

(56) References Cited

U.S. PATENT DOCUMENTS

| | | | |
|---|---|---|---|
| 6,163,216 A * | 12/2000 | Murray | H03F 3/45609 330/257 |
| 6,300,749 B1 | 10/2001 | Castelli et al. | |
| 7,843,180 B1 | 11/2010 | Cilingiroglu | |
| 8,115,463 B2 | 2/2012 | Wang | |
| 9,552,004 B1 * | 1/2017 | Dixit | G05F 1/575 |
| 2009/0115382 A1 | 5/2009 | Hasegawa et al. | |
| 2010/0045367 A1 | 2/2010 | Hasegawa et al. | |
| 2013/0271100 A1 | 10/2013 | El-Nozahi | |
| 2013/0307502 A1 | 11/2013 | Bhattacharyya et al. | |
| 2018/0181155 A1 | 6/2018 | Iizuka et al. | |

(Continued)

FOREIGN PATENT DOCUMENTS

| | | |
|---|---|---|
| CN | 100428615 | 10/2008 |
| CN | 102063145 | 5/2011 |

(Continued)

OTHER PUBLICATIONS

"Office Action of Taiwan Counterpart Application", dated May 3, 2022, p. 1-p. 6.

*Primary Examiner* — Kyle J Moody
*Assistant Examiner* — Lakaisha Jackson
(74) *Attorney, Agent, or Firm* — JCIPRNET (57) ABSTRACT

A voltage regulator is provided. The voltage regulator includes a main error amplifier, a first buffer, a second buffer, and multiple main zero compensation loops. The main error amplifier generates a first voltage signal according to a reference voltage signal and a feedback voltage signal. The first buffer provides a second voltage signal according to the first voltage signal. The second buffer provides an output voltage signal according to the second voltage signal. The main zero compensation loops are respectively coupled between an output terminal of the main error amplifier and an output terminal of the first buffer. The main zero compensation loops provide different zero compensations.

14 Claims, 10 Drawing Sheets

(56) References Cited

U.S. PATENT DOCUMENTS

| | | | |
|---|---|---|---|
| 2019/0113942 A1 | 4/2019 | Murukumpet et al. | |
| 2021/0096585 A1 | 4/2021 | Kesarwani et al. | |
| 2021/0303014 A1* | 9/2021 | Migliavacca | G05F 1/575 |
| 2022/0404852 A1* | 12/2022 | Jung | G11C 5/147 |

FOREIGN PATENT DOCUMENTS

| | | |
|---|---|---|
| CN | 102239457 | 11/2011 |
| TW | 200827971 | 7/2008 |
| TW | 200828753 | 7/2008 |
| TW | 201205226 | 2/2012 |
| TW | I586088 | 6/2017 |

* cited by examiner

VOLTAGE REGULATOR

CROSS-REFERENCE TO RELATED APPLICATION

This application claims the priority benefit of U.S. provisional application Ser. No. 63/192,583, filed on May 25, 2021. The entirety of the above-mentioned patent application is hereby incorporated by reference herein and made a part of this specification.

BACKGROUND

Technical Field

The disclosure relates to a power field, and more particularly to a voltage regulator.

Description of Related Art

A voltage regulator is a power management integrated circuit (PMIC) and may be used to manage power requirements of a host system. The voltage regulator may be used in battery-powered devices, such as smartphones, notebook computers, tablet computers, wearable apparatuses, and the like, so as to control the flow and direction of electricity in the devices. In some applications, the voltage regulator may need to meet different load requirements. When a load requirement (such as a load current) changes, unit-gain bandwidth of the voltage regulator will offset and thus affect stability of the voltage regulator.

SUMMARY

The disclosure provides a voltage regulator that may provide different zero compensations for different load requirements, which allows the voltage regulator to maintain stability under different load requirements.

The voltage regulator of the disclosure includes a main error amplifier, a first buffer, a second buffer, and multiple main zero compensation loops. The main error amplifier generates a first voltage signal according to a reference voltage signal and a feedback voltage signal, and outputs the first voltage signal through an output terminal of the main error amplifier. The first buffer is coupled to the output terminal of the main error amplifier. The first buffer receives the first voltage signal, provides a second voltage signal according to the first voltage signal, and outputs the second voltage signal at an output terminal of the first buffer. The second buffer is coupled to the output terminal of the first buffer. The second buffer receives the second voltage signal and provides an output voltage signal according to the second voltage signal. The main zero compensation loops are respectively coupled between the output terminal of the main error amplifier and the output terminal of the first buffer. The main zero compensation loops provide different zero compensations.

Based on the above, through configuration of the main zero compensation loops, the voltage regulator may provide different zero compensations for different load requirements, which allows the voltage regulator to maintain stability under different load requirements.

In order to make the aforementioned features and advantages of the disclosure comprehensible, embodiments accompanied with drawings are described in detail below.

DESCRIPTION OF THE EMBODIMENTS

Part of the embodiments of the disclosure will be described in detail below with accompanying drawings. For the reference numerals used in the following description, the same reference numerals appearing in different drawings will be regarded as the same or similar elements. These embodiments are only a part of the disclosure and do not disclose all possible implementations of the disclosure. More precisely, these embodiments only serve as examples within the scope of the claims of the disclosure.

Figure 1:
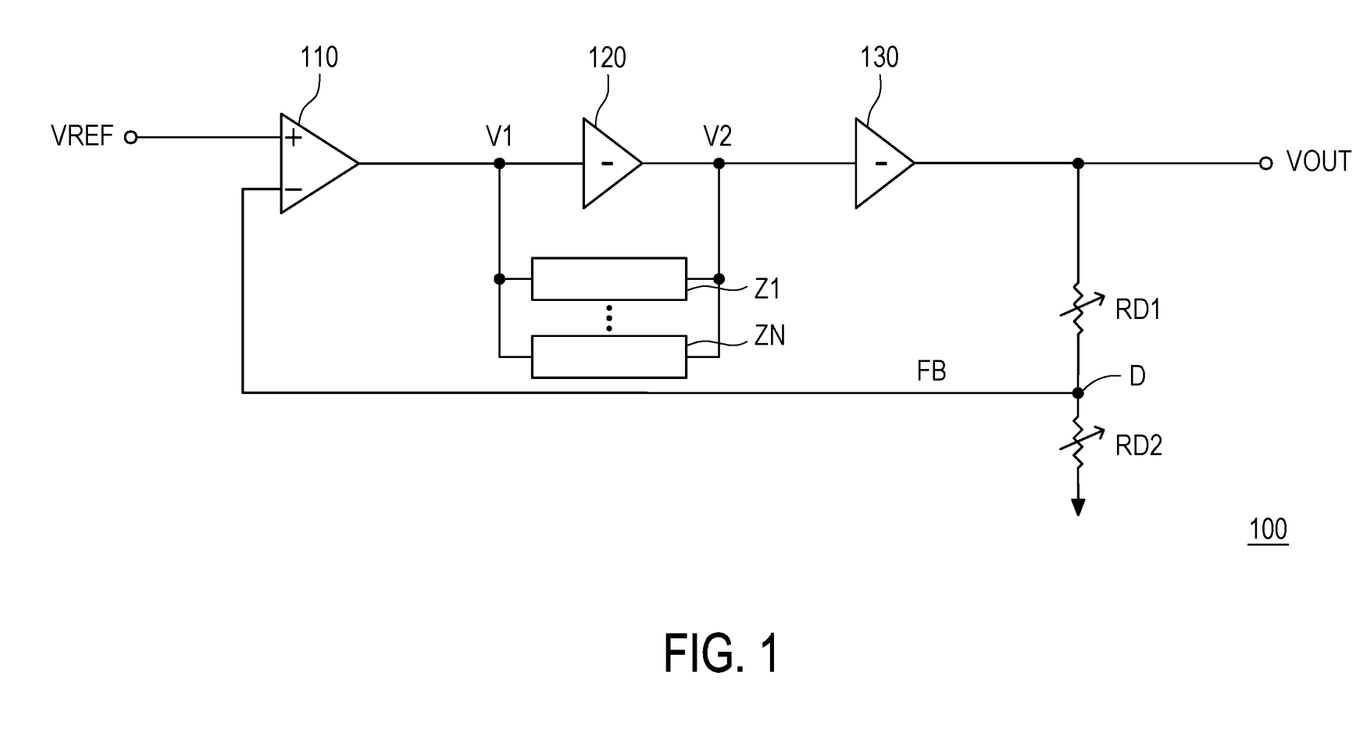
FIG. 1 is a schematic diagram of a voltage regulator according to the first embodiment of the disclosure.

With reference to FIG. 1, FIG. 1 is a schematic diagram of a voltage regulator according to the first embodiment of the disclosure. In this embodiment, a voltage regulator 100 includes a main error amplifier 110, a first buffer 120, a second buffer 130, and main zero compensation loops Z1 to ZN. The main error amplifier 110, the first buffer 120, and the second buffer 130 are serially connected to each other. The main error amplifier 110 generates a first voltage signal V1 according to a reference voltage signal VREF and a feedback voltage signal FB, and outputs the first voltage signal V1 through an output terminal of the main error amplifier 110. The first buffer 120 is coupled to the output terminal of the main error amplifier 110 for receiving the first voltage signal V1 from the main error amplifier 110. The first buffer 120 provides a second voltage signal V2 according to the first voltage signal V1, and outputs the second voltage signal V2 at an output terminal of the first buffer 120. The second buffer 130 is coupled to the output terminal of the first buffer 120 for receiving the second voltage signal V2 from the first buffer 120. The second buffer 130 provides an output voltage signal VOUT according to the second voltage signal V2.

In this embodiment, the main zero compensation loops Z1 to ZN are respectively coupled between the output terminal of the main error amplifier 110 and the output terminal of the first buffer 120. That is, the main zero compensation loops Z1 to ZN are serially coupled to the first buffer 120, respectively. In this embodiment, the main zero compensation loops Z1 to ZN are respectively designed or operated to provide different zero compensations. Furthermore, the main zero compensation loops Z1 to ZN provide N different zeros to provide different zero compensations, and N is a positive integer greater than 1.

In this embodiment, the voltage regulator 100 may be designed or operated to be adapted for multiple load requirements. Therefore, when a load requirement (such as a load current) changes, unit-gain bandwidth will offset and fall within one of multiple zero compensation intervals provided by the main zero compensation loops Z1 to ZN. In this way, the voltage regulator 100 may maintain stability under different load requirements.

In this embodiment, the voltage regulator 100 further includes variable resistors RD1 and RD2. The variable resistor RD1 is coupled between an output terminal of the second buffer 130 and a voltage division node D. The variable resistor RD2 is coupled between the voltage division node D and a reference low voltage (such as a ground). The variable resistors RD1 and RD2 may be operated to adjust voltage level of the output voltage signal VOUT and/or voltage level of the feedback voltage signal FB. The voltage division node D may provide the feedback voltage signal FB. The voltage division node D is coupled to an inverting input terminal of the main error amplifier 110. Therefore, the main error amplifier 110 receives the feedback voltage signal FB through the inverting input terminal. In addition, a non-inverting input terminal of the main error amplifier 110 receives the reference voltage signal VREF.

Figure 2:
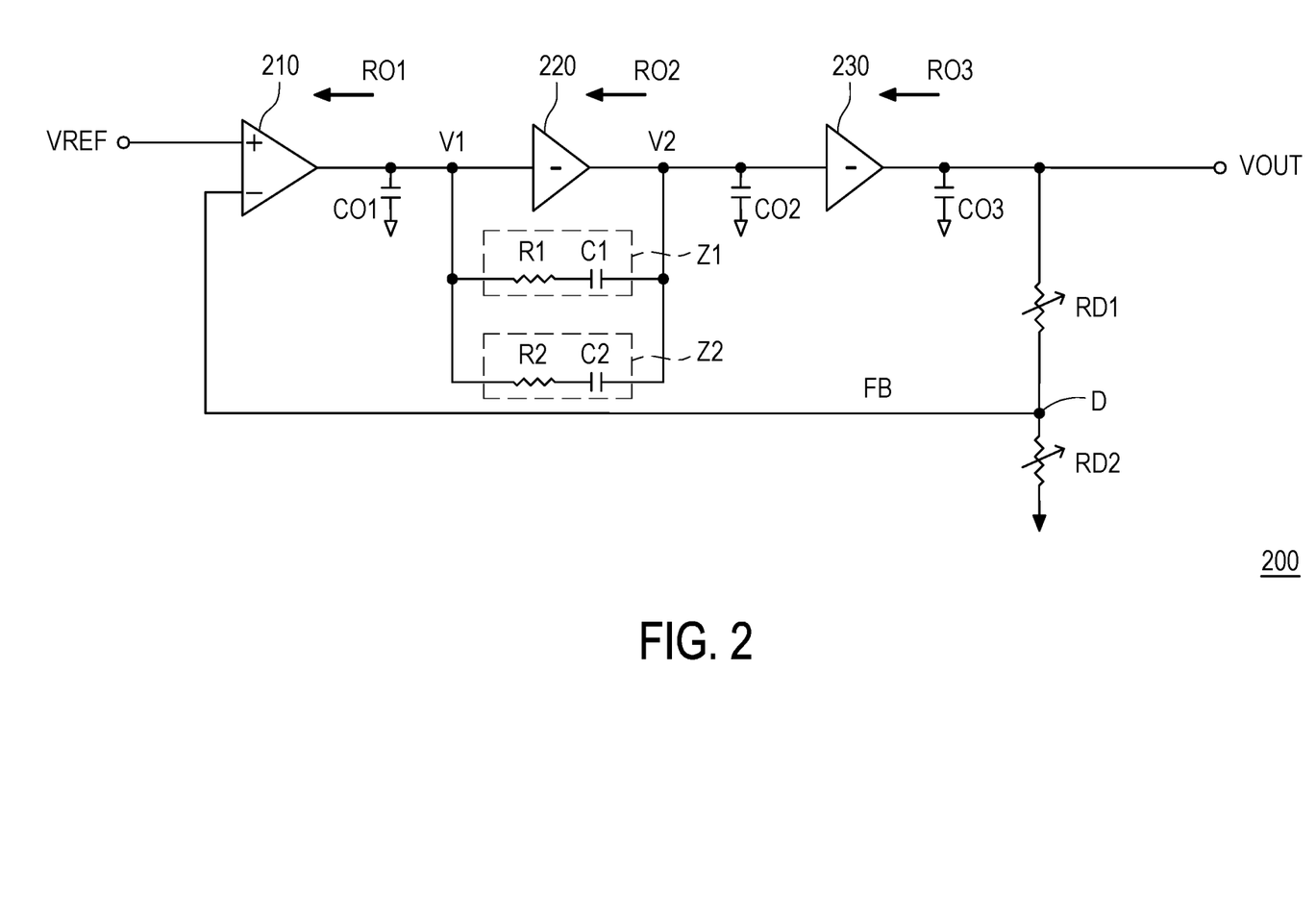
FIG. 2 is a schematic diagram of a voltage regulator according to the second embodiment of the disclosure.

With reference to FIG. 2, FIG. 2 is a schematic diagram of a voltage regulator according to the second embodiment of the disclosure. In this embodiment, a voltage regulator 200 includes a main error amplifier 210, a first buffer 220, a second buffer 230, the main zero compensation loops Z1 and Z2, and the variable resistors RD1 and RD2. Configuration of the main error amplifier 210, the first buffer 220, the second buffer 230, and the variable resistors RD1 and RD2 may be sufficiently taught in the first embodiment of FIG. 1, and thus details thereof are not described herein. In this embodiment, the main zero compensation loop Z1 includes a capacitor C1 and a resistance value generating circuit R1. The capacitor C1 and the resistance value generating circuit R1 are serially coupled between an output terminal of the main error amplifier 210 and an output terminal of the first buffer 220. The capacitor C1 provides a first capacitance value. The resistance value generating circuit R1 provides a first resistance value. The main zero compensation loop Z2 includes a capacitor C2 and a resistance value generating circuit R2. The capacitor C2 and the resistance value generating circuit R2 are serially coupled between the output terminal of the main error amplifier 210 and the output terminal of the first buffer 220. The capacitor C2 provides a second capacitance value. The resistance value generating circuit R2 provides a second resistance value. In this embodiment, the resistance value generating circuits R1 and R2 are respectively implemented as resistors.

In this embodiment, a first product of the first capacitance value and the first resistance value is different from a second product of the second capacitance value and the second resistance value. The first product is for determining a first zero, and the second product is for determining a second zero. Specifically, multiple zero frequencies may be obtained according to the following Equations (1) and (2):

$$Wz1 = \frac{-1}{c\_C2 \times r\_R2} \quad \text{Equation (1)}$$

$$Wz2 = \frac{-1}{c\_C1 \times r\_R1} \quad \text{Equation (2)}$$

In the above, Wz2 is the first zero, Wz1 is the second zero, c_C1 is the first capacitance value, c_C2 is the second capacitance value, r_R1 is the first resistance value, and r_R2 is the second resistance value. Therefore, the first zero (i.e., Wz2) may be determined based on the main zero compensation loop Z1, and the second zero (i.e., Wz1) may be determined based on the main zero compensation loop Z2.

In addition, based on configuration of the voltage regulator 200, pole frequencies may be obtained according to the following Equations (3), (4), and (5):

$$Wp3 = \frac{-1}{(RL//RO3) \times CL} \quad \text{Equation (3)}$$

$$Wp1 = \frac{-1}{(gm2 \times RO2) \times RO1 \times CS} \quad \text{Equation (4)}$$

$$Wp2 = \frac{-gm2}{(CS + CO2)} \quad \text{Equation (5)}$$

In the above, Wp3, Wp1, and Wp2 are different poles, RL is a load equivalent resistance, CL is a load equivalent capacitance, and RO3 is an output equivalent resistance of the second buffer 230. The pole Wp3 may be determined based on the load equivalent capacitance, a parallel resistance value of the output equivalent resistance RO3 of the second buffer 230, and the load equivalent resistance.

RO1 is an output equivalent resistance of the main error amplifier 210, RO2 is an output equivalent resistance of the first buffer 220, and gm2 is a conductance value of the first buffer 220. At a light load, CS is the greater one among the first capacitance value and the second capacitance value. At a heavy load, CS is the smaller one among the first capacitance value and the second capacitance value. The pole Wp1 may be determined based on a conductance value of the second buffer 230, the output equivalent resistance RO2 of the first buffer 220, the output equivalent resistance RO1 of the main error amplifier 210, and CS.

CO2 is an output equivalent capacitance of the first buffer 220. The pole Wp2 may be determined based on the conductance value of the second buffer 230, the output equivalent capacitance CO2 of the first buffer 220, and CS.

Based on configuration of this embodiment, loop gain (LG) may be obtained according to Equations (6) and (7):

$$LG(s) = \frac{A0 \times (1 + s/Wz1) \times (1 + s/Wz2)}{[(1 + s/Wp3) \times (1 + s/Wp1) \times (1 + s/Wp2)]} \quad \text{Equation (6)}$$

$$A0 = gm1 \times gm2 \times gm3 \times RO1 \times RO2 \times (RO3//RL) \quad \text{Equation (7)}$$

In the above, gm1 is a conductance value of the main error amplifier 210, and gm3 is the conductance value of the second buffer 230.

Figure 3:
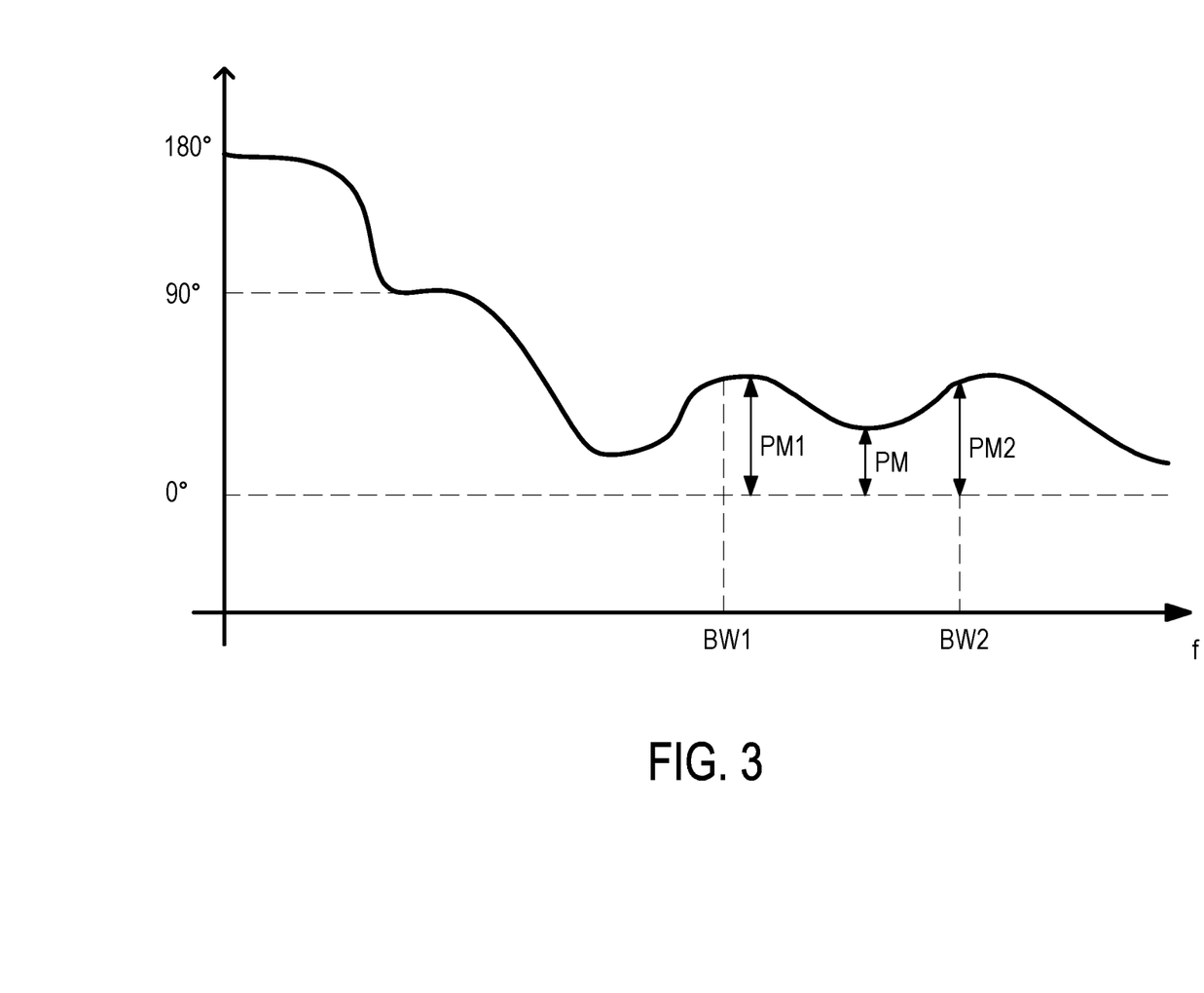
FIG. 3 is a loop gain transfer function diagram according to an embodiment of the disclosure.
Figure 4:
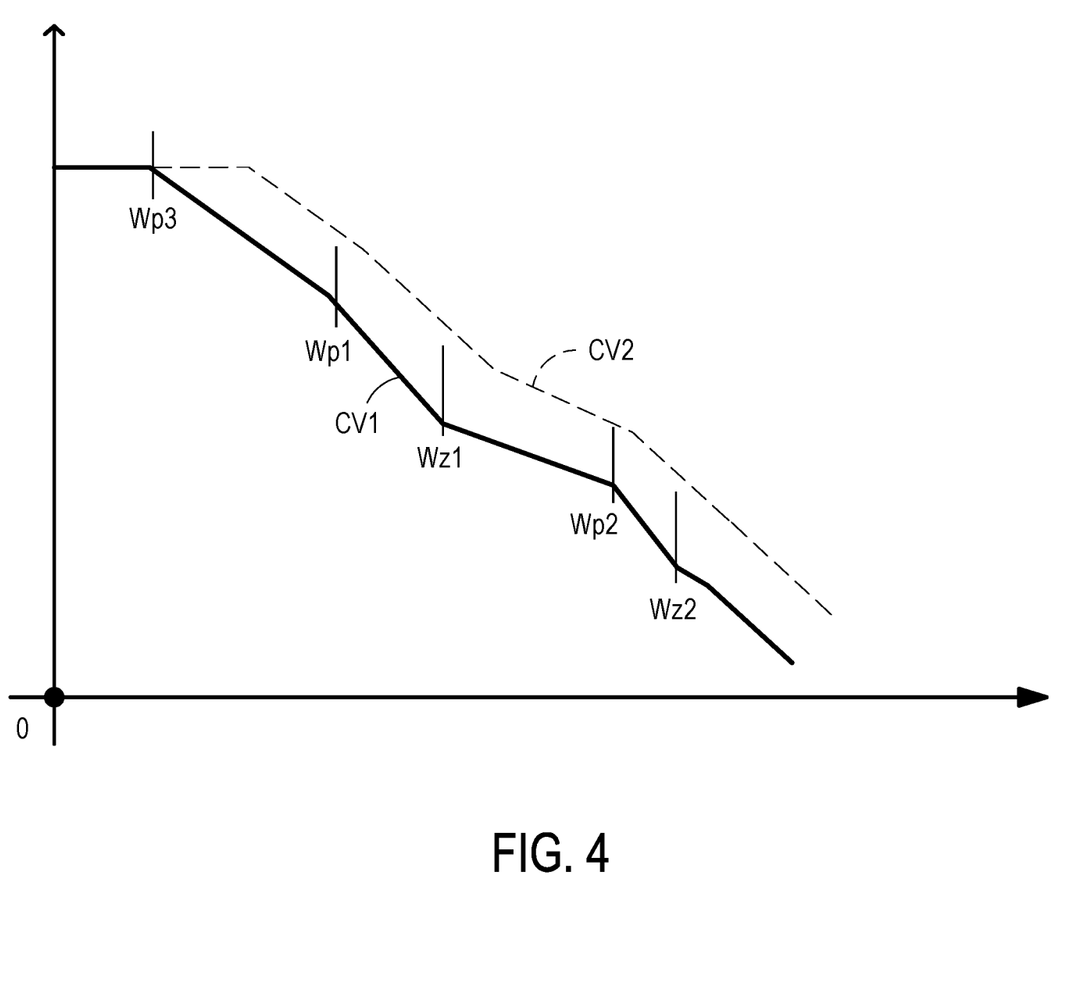
FIG. 4 is a Bode plot according to an embodiment of the disclosure.

With reference to FIG. 2, FIG. 3, and FIG. 4 together, FIG. 3 is a loop gain transfer function graph according to an embodiment of the disclosure, and FIG. 4 is a Bode plot according to an embodiment of the disclosure. In this embodiment, loop gain LG forms a curve CV1 based on a first load (such as a light load), and forms a curve CV2 based on a second load (such as a heavy load). According to Equations (3) to (6), offset between the curves CV1 and CV2 is due to changes of the poles Wp1 to Wp3 (which means CS, CL, and RL are changed). Therefore, a unit-gain bandwidth BW1 corresponding to the first load and a unit-gain bandwidth BW2 corresponding to the second load of the voltage regulator 200 are inevitably offset.

It should be noted that according to Equations (1) and (2), the first zero and the second zero are not offset by load changes. In other words, the first zero and the second zero are predefined to correspond to the unit-gain bandwidth BW1 and the unit-gain bandwidth BW2, meaning that the first zero and the second zero are designed for compensating phases corresponding to the unit-gain bandwidths BW1 and BW2. In FIG. 3, based on compensations of the first zero and the second zero, the unit-gain bandwidth BW1 has a phase margin PM1, and the unit-gain bandwidth BW2 has a phase margin PM2. The phase margins PM1 and PM2 are significantly greater than an uncompensated phase margin PM. In this way, in the unit-gain bandwidths BW1 and BW2, the voltage regulator 200 may maintain original transmission stability.

In some embodiments, the zero Wz1 may be adjusted to be more than 100 times greater than the zero Wz2. In some embodiments, the zero Wz1 is disposed after one among the poles Wp1 to Wp3 at the light load, and the zero Wz2 is disposed after another one among the poles Wp1 to Wp3 at the light load.

The disclosure may provide a corresponding number of zeros according to the number of load requirements. In other words, if there are N types of load requirements, there are N main zero compensation loops. The number of the main zero compensation loops in the disclosure is not limited to the embodiment shown in FIG. 2.

Figure 5:
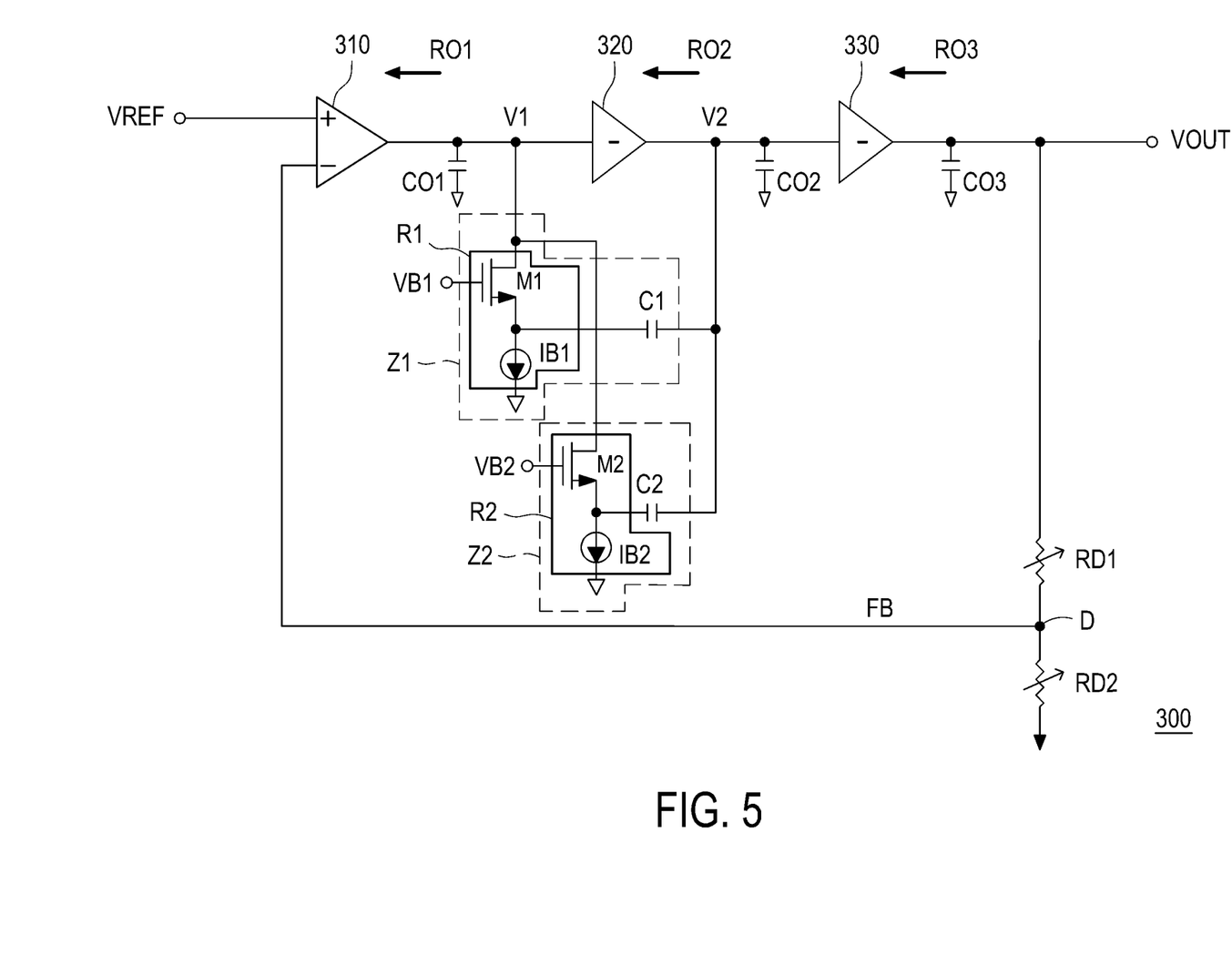
FIG. 5 is a schematic diagram of a voltage regulator according to the third embodiment of the disclosure.

With reference to FIG. 5, FIG. 5 is a schematic diagram of a voltage regulator according to the third embodiment of the disclosure. In this embodiment, a voltage regulator 300 includes a main error amplifier 310, a first buffer 320, a second buffer 330, the main zero compensation loops Z1 and Z2, and the variable resistors RD1 and RD2. Configuration of the main error amplifier 310, the first buffer 320, the second buffer 330, and the variable resistors RD1 and RD2 may be sufficiently taught in the first embodiment of FIG. 1, and thus details thereof are not described herein. In this embodiment, the main zero compensation loop Z1 includes the capacitor C1 and the resistance value generating circuit R1. The capacitor C1 provides the first capacitance value, and the resistance value generating circuit R1 provides the first resistance value. The main zero compensation loop Z2 includes the capacitor C2 and the resistance value generating circuit R2. The capacitor C2 provides the second capacitance value, and the resistance value generating circuit R2 provides the second resistance value. The difference from FIG. 2 is that the resistance value generating circuit R1 of this embodiment includes a transistor M1. The transistor M1 and the capacitor C1 are serially coupled between an output terminal of the main error amplifier 310 and an output terminal of the first buffer 320. The resistance value generating circuit R2 includes a transistor M2. The transistor M2 and the capacitor C2 are serially coupled between the output terminal of the main error amplifier 310 and the output terminal of the first buffer 320.

Taking the main zero compensation loop Z1 as an example, a first terminal of the transistor M1 is coupled to a first terminal of the capacitor C1. A second terminal of the transistor M1 serves as a terminal of the main zero compensation loop Z1. A control terminal of the transistor M1 receives a bias voltage VB. A second terminal of the capacitor C1 serves as another terminal of the main zero compensation loop Z1. The transistor M1 may operate in one of a linear region and a saturation region based on the bias voltage VB1.

Taking the main zero compensation loop Z2 as an example, a first terminal of the transistor M2 is coupled to a first terminal of the capacitor C2. A second terminal of the transistor M2 serves as a terminal of the main zero compensation loop Z2. A control terminal of the transistor M2 receives a bias voltage VB2. A second terminal of the capacitor C2 serves as another terminal of the main zero compensation loop Z2. The transistor M2 may operate in one of the linear region and the saturation region based on the bias voltage VB2.

In this embodiment, the bias voltages VB1 and VB2 are different, allowing the transistors M1 and M2 to generate different resistance values. In some embodiments, the transistors M1 and M2 may be designed in different ways to generate different resistance values. The transistors M1 and M2 may be implemented by any type of transistors known to people skilled in the art.

In this embodiment, the main zero compensation loop Z1 further includes a current source IB1. The current source IB1 is coupled between the first terminal of the transistor M1 and the reference low voltage. A current value of the current source IB1 may also determine the first resistance value provided by the transistor M1. The main zero compensation loop Z2 further includes a current source IB2. The current source IB2 is coupled between the first terminal of the transistor M2 and the reference low voltage. A current value of the current source IB2 may also determine the second resistance value provided by the transistor M2.

Figure 6:
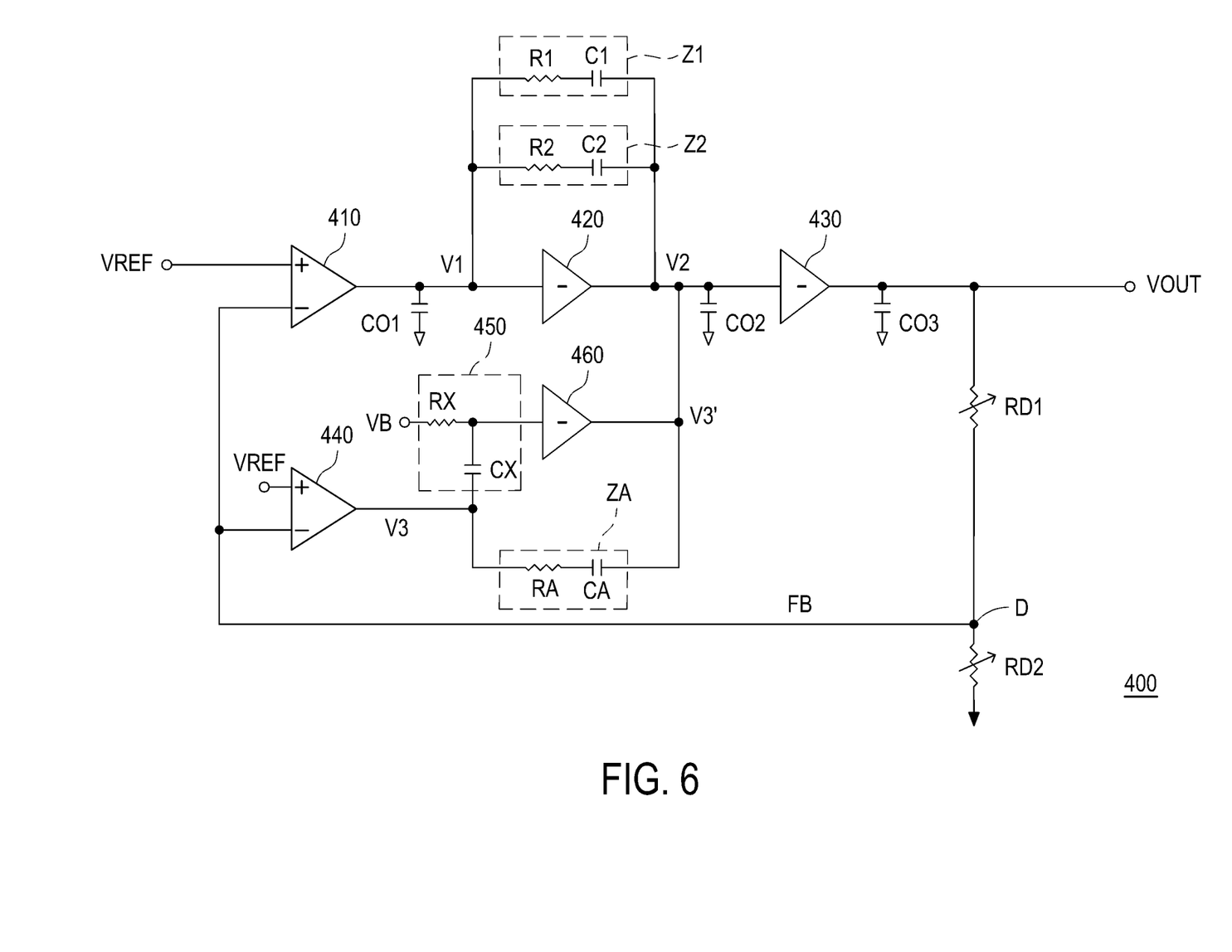
FIG. 6 is a schematic diagram of a voltage regulator according to the fourth embodiment of the disclosure.

In some embodiments of the disclosure, the voltage regulator further provides a compensation signal by using the reference voltage signal and the feedback voltage signal, and compensates the second signal by using the compensation signal. With reference to FIG. 6, FIG. 6 is a schematic diagram of a voltage regulator according to the fourth embodiment of the disclosure. Compared with the second embodiment, a voltage regulator 400 further includes an auxiliary error amplifier 440, a high-pass filter 450, and a third buffer 460. A non-inverting input terminal of the auxiliary error amplifier 440 is for receiving the reference voltage signal VREF. An inverting input terminal of the auxiliary error amplifier 440 is for receiving the feedback voltage signal FB. The auxiliary error amplifier 440 provides a third voltage signal V3 according to the reference voltage signal VREF and the feedback voltage signal FB. An output terminal of the auxiliary error amplifier 440 is for outputting the third voltage signal V3. The high-pass filter 450 is coupled between the output terminal of the auxiliary error amplifier and an input terminal of the third buffer 460. The high-pass filter 450 filters the third voltage signal V3 for retaining high frequency components of the third voltage signal V3. In other words, the high-pass filter 450 only retains high frequency fluctuations of the third voltage signal V3 and filters out middle and low frequency components of the third voltage signal V3. Therefore, a compensation signal V3' is a high frequency AC signal. The third buffer 460 is coupled to the high-pass filter 450 and an output terminal of the first buffer 420. The third buffer 460 responds to the high frequency components of the third voltage signal V3 to provide the compensation signal V3'.

In this embodiment, the auxiliary error amplifier 440 is implemented as a trans-impedance amplifier (TIA) having a high bandwidth. Therefore, the response speed of the auxiliary error amplifier 440 is faster than the response speed of the main error amplifier 410. Therefore, the response speed of the auxiliary error amplifier 440 in response to load changes is significantly faster than the response speed of the main error amplifier 410 in response to load changes.

It should be noted that since the response speed of the auxiliary error amplifier 440 is faster than the response speed of the main error amplifier 410, and the compensation signal V3' is a high frequency signal, the voltage regulator 400 may provide transient response in response to high frequency changes at load terminals, thereby providing the corresponding compensation signal V3' of high frequency in time.

Implementation of the main error amplifier 410, the first buffer 420, the second buffer 430, the main zero compensation loops Z1 and Z2, and the variable resistors RD1 and RD2 may be sufficiently taught in the embodiment of FIG. 1 to FIG. 4, and thus details thereof are not described herein.

In this embodiment, the voltage regulator 400 further includes an auxiliary zero compensation loop ZA. The auxiliary zero compensation loop ZA is parallel coupled to the third buffer 460. The auxiliary zero compensation loop ZA is designed or operated to provide a zero compensation for the compensation signal V3'. In this embodiment, the auxiliary zero compensation loop ZA includes an auxiliary capacitor CA and an auxiliary resistance value generating circuit RA. The auxiliary capacitor CA provides an auxiliary capacitance value. The auxiliary resistance value generating circuit RA is serially coupled to the auxiliary capacitor CA. The auxiliary resistance value generating circuit RA provides an auxiliary resistance value. In this embodiment, the auxiliary resistance value generating circuit RA may be implemented as a resistor.

In this embodiment, a product of the auxiliary capacitance value and the auxiliary resistance value is less than the first product of the first capacitance value and the first resistance value. The product of the auxiliary capacitance value and the auxiliary resistance value is less than the second product of the second capacitance value and the second resistance value. Therefore, the auxiliary zero compensation loop ZA may provide a zero compensation of higher frequency.

In some embodiments, the auxiliary resistance value generating circuit RA may be implemented as the resistance value generating circuit R1 similar to FIG. 5.

In this embodiment, the high-pass filter 450 includes a capacitor CX and a resistor RX. The capacitor CX is coupled between the output terminal of the auxiliary error amplifier 440 and the input terminal of the third buffer 460. The resistor RX is coupled between the input terminal of the third buffer 460 and the bias voltage VB. The bias voltage VB is a bias that allows the third buffer 460 to operate.

Figure 7:
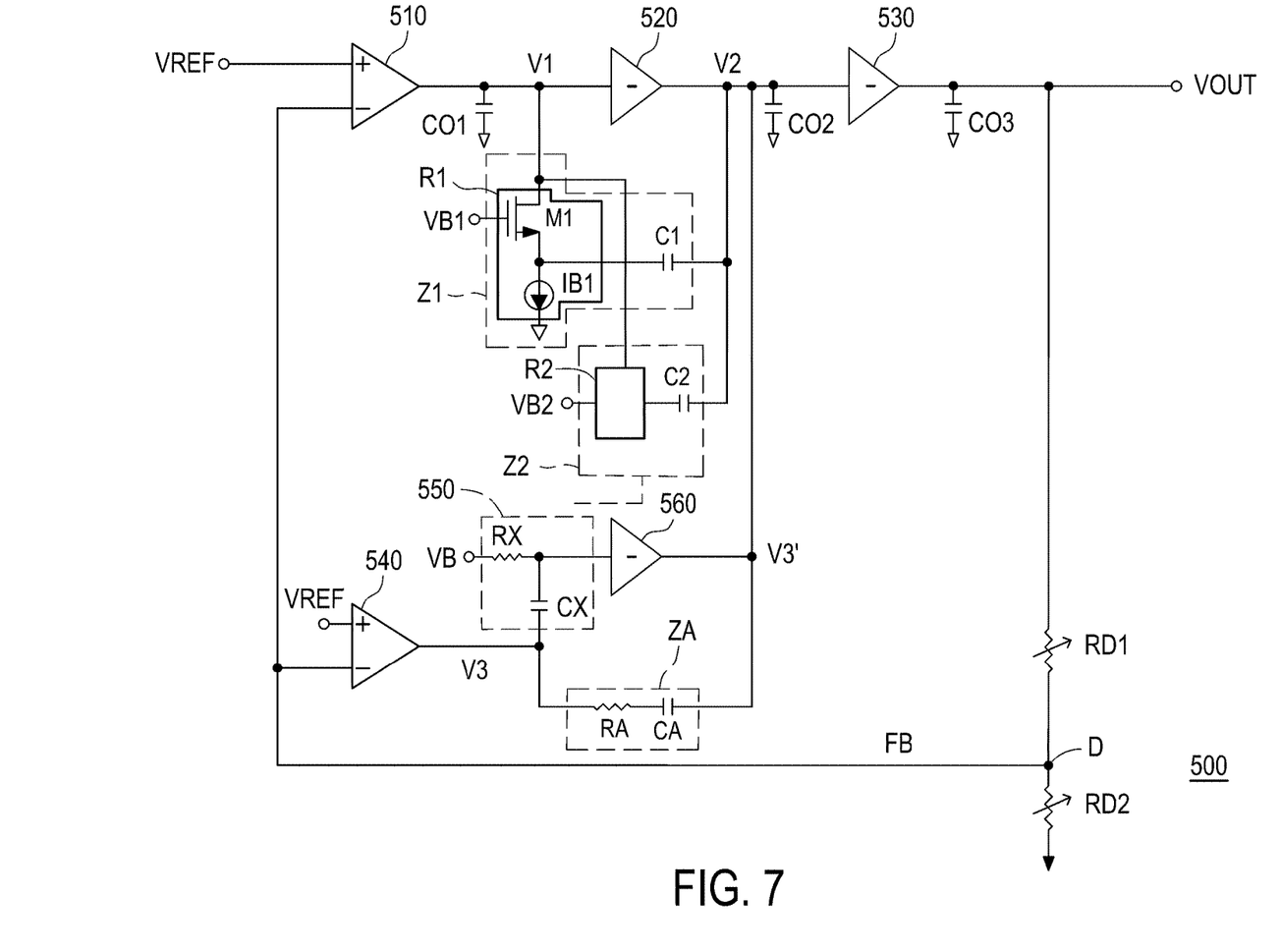
FIG. 7 is a schematic diagram of a voltage regulator according to the fifth embodiment of the disclosure.

With reference to FIG. 7, FIG. 7 is a schematic diagram of a voltage regulator according to the fifth embodiment of the disclosure. In this embodiment, a voltage regulator 500 includes a main error amplifier 510, a first buffer 520, a second buffer 530, the main zero compensation loops Z1 and Z2, the variable resistors RD1 and RD2, an auxiliary error amplifier 540, a high-pass filter 550, a third buffer 560, and the auxiliary resistance value generating circuit RA. The difference from the embodiment of FIG. 6 is that the resistance value generating circuit R1 of the main zero compensation loop Z1 of this embodiment is implemented as the implementation of the resistance value generating circuit R1 of FIG. 5. In addition, the resistance value generating circuit R2 of the main zero compensation loop Z2 of this embodiment is implemented as the implementation of the resistance value generating circuit R2 of FIG. 5.

Figure 8:
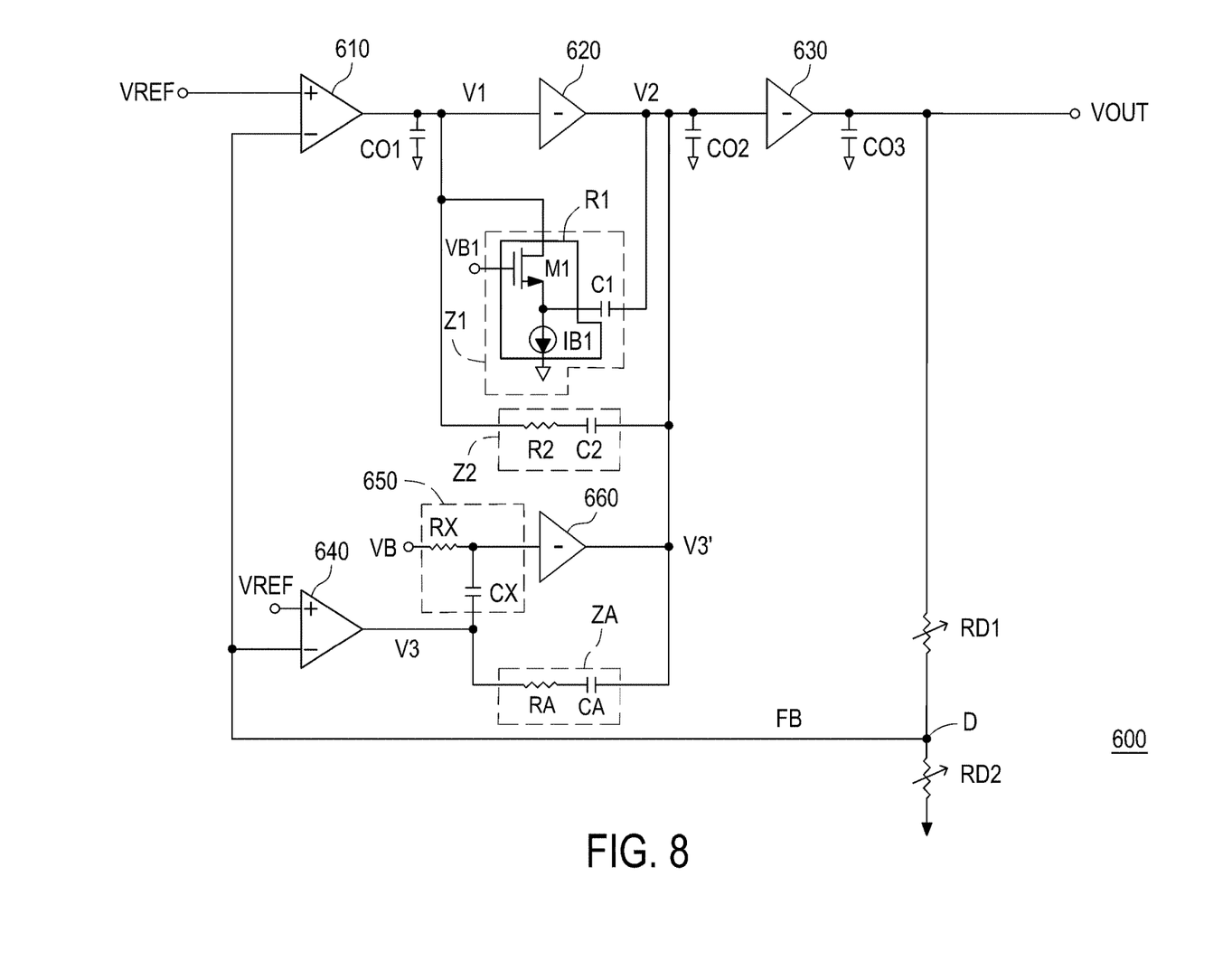
FIG. 8 is a schematic diagram of a voltage regulator according to the sixth embodiment of the disclosure.

With reference to FIG. 8, FIG. 8 is a schematic diagram of a voltage regulator according to the sixth embodiment of the disclosure. In this embodiment, a voltage regulator 600 includes a main error amplifier 610, a first buffer 620, a second buffer 630, the main zero compensation loops Z1 and Z2, the variable resistors RD1 and RD2, an auxiliary error amplifier 640, a high-pass filter 650, a third buffer 660, and the auxiliary resistance value generating circuit RA. The difference from the embodiment of FIG. 6 is that the resistance value generating circuit R1 of the main zero compensation loop Z1 of this embodiment is implemented as the implementation of the resistance value generating circuit R1 of FIG. 5.

Low-cost implementation of the main error amplifier, the first buffer, the second buffer, the auxiliary error amplifier, and the third buffer will be described below.

Figure 9:
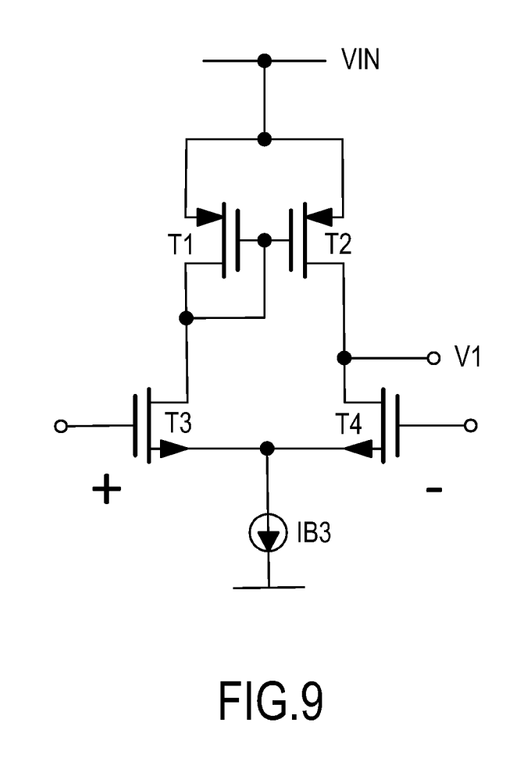
FIG. 9 is a schematic circuit diagram of a main error amplifier according to an embodiment of the disclosure.

With reference to FIG. 9, FIG. 9 is a schematic circuit diagram of a main error amplifier according to an embodiment of the disclosure. In this embodiment, the main error amplifier includes transistors T1 to T4 and a current source IB3. The transistors T1 and T2 are respectively P-type metal-oxide-semiconductor field-effect transistors (MOSFETs). The transistors T3 and T4 are respectively N-type MOSFETs. A source terminal of the transistor T1 is coupled to a driving voltage VIN. A gate terminal of the transistor T1 is coupled to a drain terminal of the transistor T1. A source terminal of the transistor T2 is coupled to the driving voltage VIN. A gate terminal of the transistor T2 is coupled to the gate terminal of the transistor T1. A drain terminal of the transistor T2 serves as an output terminal of the main error amplifier. A drain terminal of the transistor T3 is coupled to the drain terminal of the transistor T1. A gate terminal of the transistor T3 serves as a non-inverting input terminal of the main error amplifier. A drain terminal of the transistor T4 is coupled to the drain terminal of the transistor T2. A gate terminal of the transistor T4 serves as an inverting input terminal of the main error amplifier. A source terminal of the transistor T4 is coupled to a source terminal of the transistor T3. The current source IB3 is coupled between the source terminals of the transistors T3 and T4 and the reference low voltage. The main error amplifier shown in FIG. 9 may be adapted for the main error amplifier 110 of FIG. 1, the main error amplifier 210 of FIG. 2, the main error amplifier 310 of FIG. 5, the main error amplifier 410 of FIG. 6, the main error amplifier 510 of FIG. 7, and the main error amplifier 610 in FIG. 8.

Figure 10:
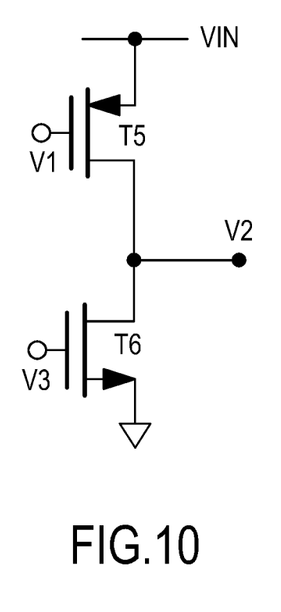
FIG. 10 is a schematic circuit diagram of a first buffer and a third buffer according to an embodiment of the disclosure.

With reference to FIG. 10, FIG. 10 is a schematic circuit diagram of a first buffer and a third buffer according to an embodiment of the disclosure. In this embodiment, a transistor T5 may serve as the first buffer. A transistor T6 may serve as the third buffer. The transistor T5 may be a P-type MOSFET. The transistor T6 may be an N-type MOSFET. A source terminal of the transistor T5 is coupled to the driving voltage VIN. A gate terminal of the transistor T5 serves as an input terminal of the first buffer for receiving the first voltage signal V1. A drain terminal of the transistor T5 serves as an output terminal of the first buffer for outputting the second voltage signal V2. The transistor T5 may be adapted for serving as the first buffer 120 in FIG. 1, the first buffer 220 in FIG. 2, the first buffer 320 in FIG. 5, the first buffer 420 in FIG. 6, the first buffer 520 in FIG. 7, and the first buffer 620 in FIG. 8.

A drain terminal of the transistor T6 serves as an output terminal of the third buffer. A source terminal of the transistor T6 is coupled to the reference low voltage. A gate terminal of the transistor T6 serves as an input terminal of the third buffer for receiving the filtered third voltage signal V3. The transistor T6 may be adapted for serving as the third buffer 460 in FIG. 6, the third buffer 560 in FIG. 7, and the third buffer 660 in FIG. 8.

In this embodiment, the transistors T5 and T6 may be operated to function in the linear area.

Figure 11:
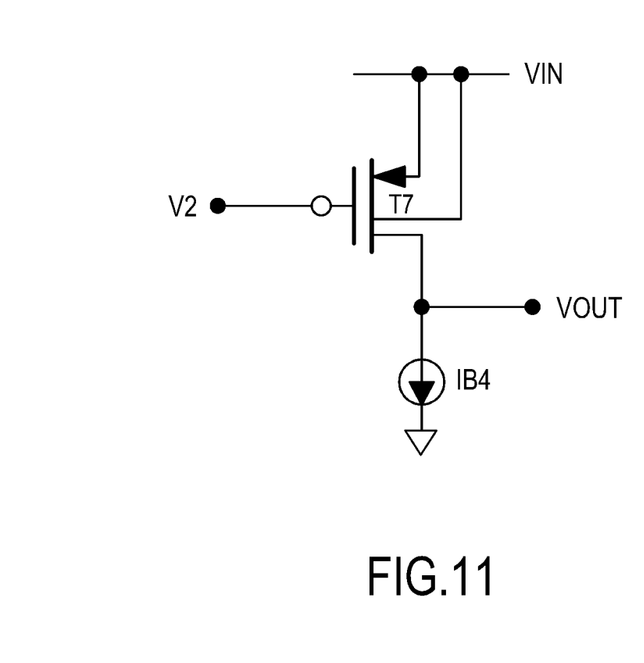
FIG. 11 is a schematic circuit diagram of a second buffer according to an embodiment of the disclosure.

With reference to FIG. 11, FIG. 11 is a schematic circuit diagram of a second buffer according to an embodiment of the disclosure. In this embodiment, the second buffer includes a transistor T7 and a current source IB4. The transistor T7 is a P-type MOSFET. A source terminal and a base terminal of the transistor T7 are coupled to the driving voltage VIN. A gate terminal of the transistor T7 serves as an input terminal of the second buffer for receiving the second voltage signal V2. A drain terminal of the transistor T7 serves as the output terminal of the first buffer for outputting the output voltage signal VOUT. The second buffer shown in FIG. 11 may be adapted for the second buffer 130 of FIG. 1, the second buffer 230 of FIG. 2, the second buffer 330 of FIG. 5, the second buffer 430 of FIG. 6, the second buffer 530 of FIG. 7, and the second buffer 630 of FIG. 8.

Figure 12:
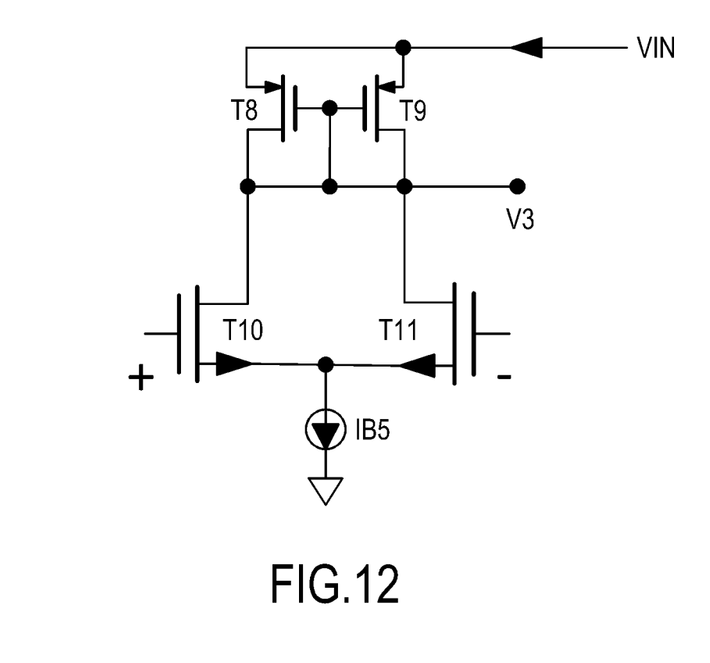
FIG. 12 is a schematic circuit diagram of an auxiliary error amplifier according to an embodiment of the disclosure.

With reference to FIG. 12, FIG. 12 is a schematic circuit diagram of an auxiliary error amplifier according to an embodiment of the disclosure. In this embodiment, the auxiliary error amplifier includes transistors T8 to T11 and a current source IB5. The transistors T8 and T9 are respectively P-type MOSFETs. The transistors T10 and T11 are respectively N-type MOSFETs. A source terminal of the transistor T8 is coupled to the driving voltage VIN. A gate terminal of the transistor T8 is coupled to a drain terminal of the transistor T8. A source terminal of the transistor T9 is coupled to the driving voltage VIN. A gate terminal of the transistor T9 is coupled to the gate terminal of the transistor T8. A drain terminal of the transistor T9 serves as an output terminal of the auxiliary error amplifier. A drain terminal of the transistor T10 is coupled to the drain terminal of the transistor T8. A gate terminal of the transistor T10 serves as a non-inverting input terminal of the auxiliary error amplifier. A drain terminal of the transistor T11 is coupled to the drain terminal of the transistor T9. A gate terminal of the transistor T11 serves as an inverting input terminal of the auxiliary error amplifier. A source terminal of the transistor T11 is coupled to a source terminal of the transistor T10. The current source IB3 is coupled between the source terminals of the transistors T3 and T4 and the reference low voltage. The auxiliary error amplifier shown in FIG. 12 may be adapted for serving as the auxiliary error amplifier 440 in FIG. 6, the auxiliary error amplifier 540 in FIG. 7, and the auxiliary error amplifier 640 in FIG. 8. The circuit size in FIG. 12 is, for example, about one tenth of the circuit size in FIG. 9.

In some embodiments, part of multiple current sources (such as the current sources IB1 to IB5) may be shared if having the same design. Taking FIG. 5 and FIG. 9 as examples, if the current sources IB1 and IB3 have the same design, the first terminal of the transistor M1 may be coupled to the current source IB3. Therefore, the current source IB1 may be omitted.

In summary, based on configuration of the main zero compensation loops, the voltage regulator of the disclosure may provide different zero compensations for different load requirements, which allows the voltage regulator to maintain stability under different load requirements. In addition, the voltage regulator may respond to high frequency changes at load terminals to provide transient response.

Although the disclosure has been described with reference to the above embodiments, they are not intended to limit the disclosure. It will be apparent to one of ordinary skill in the art that modifications to the described embodiments may be made without departing from the spirit and the scope of the disclosure. Accordingly, the scope of the disclosure will be defined by the attached claims and their equivalents and not by the above detailed descriptions.

What is claimed is:

1. A voltage regulator, comprising:
   a main error amplifier, configured to generate a first voltage signal according to a reference voltage signal and a feedback voltage signal, and output the first voltage signal through an output terminal of the main error amplifier;
   a first buffer, coupled to the output terminal of the main error amplifier, and configured to receive the first voltage signal, provide a second voltage signal according to the first voltage signal, and output the second voltage signal at an output terminal of the first buffer;
   a second buffer, coupled to the output terminal of the first buffer, and configured to receive the second voltage signal and provide an output voltage signal according to the second voltage signal; and
   a plurality of main zero compensation loops, respectively coupled between the output terminal of the main error amplifier and the output terminal of the first buffer, and configured to provide a plurality of zero compensations which are different.

2. The voltage regulator according to claim 1, further comprising:
   a first variable resistor, coupled between an output terminal of the second buffer and a voltage division node; and
   a second variable resistor, coupled between the voltage division node and a reference low voltage,
   wherein a non-inverting input terminal of the main error amplifier receives the reference voltage signal, and an inverting input terminal of the main error amplifier is coupled to the voltage division node for receiving the feedback voltage signal.

3. The voltage regulator according to claim 1, wherein:
   a first main zero compensation loop among the main zero compensation loops comprises:
      a first capacitor, configured to provide a first capacitance value; and
      a first resistance value generating circuit, serially coupled to the first capacitor, and configured to provide a first resistance value, and
   a second main zero compensation loop among the main zero compensation loops comprises:
      a second capacitor, configured to provide a second capacitance value; and
      a second resistance value generating circuit, serially coupled to the second capacitor, and configured to provide a second resistance value.

4. The voltage regulator according to claim 3, wherein a first product of the first capacitance value and the first resistance value is different from a second product of the second capacitance value and the second resistance value.

5. The voltage regulator according to claim 4, wherein:
   the first product is for determining a first zero, and
   the second product is for determining a second zero.

6. The voltage regulator according to claim 3, wherein the first resistance value generating circuit is a resistor.

7. The voltage regulator according to claim 3, wherein the first resistance value generating circuit comprises:

a transistor, along with the first capacitor, both serially coupled between the output terminal of the main error amplifier and the output terminal of the first buffer.

8. The voltage regulator according to claim 7, wherein:
a first terminal of the transistor is coupled to a first terminal of the first capacitor,
a second terminal of the transistor serves as a terminal of the first main zero compensation loop,
a control terminal of the transistor receives a bias voltage, and
a second terminal of the first capacitor serves as another terminal of the first main zero compensation loop.

9. The voltage regulator according to claim 7, wherein the first resistance value generating circuit further comprises:
a current source, coupled between the first terminal of the transistor and the reference low voltage.

10. The voltage regulator according to claim 3, wherein the voltage regulator further provides a compensation signal by using the reference voltage signal and the feedback voltage signal, and performs compensation on the second signal by using the compensation signal.

11. The voltage regulator according to claim 10, further comprising:
an auxiliary error amplifier, generating a third voltage signal according to the reference voltage signal and the feedback voltage signal, and outputting the third voltage signal through an output terminal of the auxiliary error amplifier;
a high-pass filter, coupled between the output terminal of the auxiliary error amplifier and an input terminal of a third buffer, and configured to filter the third voltage signal for retaining high frequency components of the third voltage signal; and
the third buffer, coupled to the high-pass filter and the output terminal of the first buffer, and configured to respond to the high frequency components of the third voltage signal to provide the compensation signal.

12. The voltage regulator according to claim 11, further comprising:
an auxiliary zero compensation loop, serially coupled to the third buffer, and configured to provide a zero compensation for the compensation signal.

13. The voltage regulator according to claim 12, wherein the auxiliary zero compensation loop comprises:
an auxiliary capacitor, configured to provide an auxiliary capacitance value; and
an auxiliary resistance value generating circuit, serially coupled to the auxiliary capacitor, and configured to provide the auxiliary resistance value.

14. The voltage regulator according to claim 12, wherein:
a product of the auxiliary capacitance value and the auxiliary resistance value is less than a first product of the first capacitance value and the first resistance value, and
the product of the auxiliary capacitance value and the auxiliary resistance value is less than a second product of the second capacitance value and the second resistance value.

\* \* \* \* \*